(12) United States Patent
Timopheev et al.

(10) Patent No.: US 12,174,276 B2
(45) Date of Patent: Dec. 24, 2024

(54) MAGNETORESISTIVE ELEMENT FOR A 2D MAGNETIC SENSOR HAVING A REDUCED HYSTERESIS RESPONSE

(71) Applicant: Allegro MicroSystems, LLC, Manchester, NH (US)

(72) Inventors: Andrey Timopheev, Vif (FR); Nikita Strelkov, Meylan (FR); Jeffrey Childress, San Jose, CA (US)

(73) Assignee: Allegro MicroSystems, LLC, Manchester, NH (US)

( * ) Notice: Subject to any disclaimer, the term of this patent is extended or adjusted under 35 U.S.C. 154(b) by 121 days.

(21) Appl. No.: 18/245,380

(22) PCT Filed: Sep. 14, 2021

(86) PCT No.: PCT/IB2021/058336
§ 371 (c)(1),
(2) Date: Mar. 15, 2023

(87) PCT Pub. No.: WO2022/058875
PCT Pub. Date: Mar. 24, 2022

(65) Prior Publication Data
US 2023/0296703 A1    Sep. 21, 2023

(30) Foreign Application Priority Data
Sep. 18, 2020    (EP) .................................... 20315414

(51) Int. Cl.
*G01R 33/09*    (2006.01)
(52) U.S. Cl.
CPC .................................. *G01R 33/098* (2013.01)
(58) Field of Classification Search
CPC .. G01R 33/098; G01R 33/0052; G01R 33/14; H01F 10/3254; H01F 10/3272
See application file for complete search history.

(56) References Cited

U.S. PATENT DOCUMENTS

2001/0038927 A1 *  11/2001  Hasewaga ........... H01F 10/3263
2001/0055185 A1 *  12/2001  Ooshima ................ B82Y 25/00
                                                            360/324.11

(Continued)

FOREIGN PATENT DOCUMENTS

EP            1727149 A1     11/2006
JP         2004-172599 A      6/2004

(Continued)

OTHER PUBLICATIONS

Japanese Office Action (English Translation Only) issued on Jun. 26, 2024 for Japanese Application No. 2023-515805; 3 Pages.

(Continued)

*Primary Examiner* — Alvaro E Fortich
(74) *Attorney, Agent, or Firm* — DALY, CROWLEY, MOFFORD & DURKEE, LLP

(57) ABSTRACT

A magnetoresistive element for a 2D magnetic sensor, the magnetoresistive element including a tunnel barrier layer included between a reference layer having a reference magnetization and a sense layer having a sense magnetization. The sense layer includes a sense synthetic antiferromagnetic structure including a first sense sublayer in contact with the tunnel barrier layer and separated from a second sense sublayer by a first non-magnetic spacer layer such that the first sense sublayer is antiferromagnetically coupled to the second sense sublayer. The sense layer is configured such that a sense magnetic ratio ΔM defined as:

$$\Delta M = \frac{M_{S_{FM2}} t_{FM2} - M_{S_{FM1}} t_{FM1}}{M_{S_{FM2}} t_{FM2} + M_{S_{FM1}} t_{FM1}}$$

wherein $M_{S_{FM1}}$ and $M_{S_{FM2}}$ are the spontaneous magnetizations of the first and second sense sublayers and $t_{FM1}$ and (Continued)

$t_{FM2}$ are the thicknesses of the first and second sense sublayers; and wherein the sense magnetic ratio is between 0.1 and 0.25.

14 Claims, 6 Drawing Sheets

(56) References Cited

U.S. PATENT DOCUMENTS

| | | |
|---|---|---|
| 2009/0121710 A1 | 5/2009 | Wang et al. |
| 2009/0219754 A1* | 9/2009 | Fukumoto ............... G11C 11/16 |
| | | 365/158 |
| 2010/0255349 A1* | 10/2010 | Gao ....................... H10N 50/10 |
| | | 428/811.1 |
| 2010/0316890 A1 | 12/2010 | Choi et al. |
| 2017/0125050 A1* | 5/2017 | Kataoka ............... G11B 5/8404 |
| 2017/0140781 A1 | 5/2017 | Sapozhnikov et al. |

FOREIGN PATENT DOCUMENTS

| | | |
|---|---|---|
| JP | 2006-332527 A | 12/2006 |
| JP | 2006-352062 A | 12/2006 |
| JP | 2007-096092 A | 4/2007 |
| JP | 2008-109118 A | 5/2008 |
| WO | WO 2007/015355 A1 | 2/2007 |
| WO | WO 2009/054062 A1 | 4/2009 |

OTHER PUBLICATIONS

International Search Report issued in Application No. PCT/IB2021/058336 dated Dec. 10, 2021.
Written Opinion for PCT/IB2021/058336 dated Dec. 10, 2021.
Response (with Machine English Translation) to Japanese Office Action issued on Jun. 26, 2024 for Japanese Application No. 2023-515805; Response Filed Aug. 26, 2024; 16 Pages.
Japanese Decision to Grant (with Machine English Translation) and Allowed Claims dated Aug. 30, 2024 for Japanese Application No. 2023-515805; 6 Pages.

* cited by examiner

MAGNETORESISTIVE ELEMENT FOR A 2D MAGNETIC SENSOR HAVING A REDUCED HYSTERESIS RESPONSE

CROSS-REFERENCE TO RELATED APPLICATIONS

This application is a national phase of PCT/IB2021/058336 filed on Sep. 14, 2021, which claims the priority of European Application No. 20315414.1, filed on Sep. 18, 2020. The entire contents of these applications are hereby incorporated by reference in their entireties.

TECHNICAL DOMAIN

The present invention concerns a magnetoresistive element adapted to sense an external magnetic field and having a reduced hysteresis in its response with varying angle of the external magnetic field. The present invention concerns further concerns a 2D magnetic sensor comprising a plurality of the magnetoresistive element.

RELATED ART

FIG. 1 shows a conventional magnetoresistive element 10 comprising a reference layer 21 having a reference magnetization 210, comprises a tunnel barrier layer 22 and a sense layer 23 having a sense magnetization 230. In FIG. 1, the reference layer 21 comprises a synthetic antiferromagnetic (SAF) structure including a first reference sublayer 211 separated from a second reference sublayer 212 by a first non-magnetic spacer layer 213 such that the first reference sublayer 211 is antiferromagnetically coupled to the second reference sublayer 212.

Sensor applications of the magnetoresistive element 10 require that the reference magnetization 210 is fixed such that it is not orientable by an external magnetic field to be measured. To that end, the reference magnetization 210 is pinned by a pinning layer 24, such as an antiferromagnetic layer, by exchange coupling. In contrast, the sense magnetization 230 is free such that it can be aligned by the external magnetic field to be sensed.

Moreover, in order to obtain a good sensitivity to the external magnetic field to be measured, the sense magnetization 230 is saturated. However, the saturated sense magnetization 230 induces a local magnetic stray field, shown by numeral 55 in FIG. 1, coupling with the reference layer 21 in a closed magnetic flux configuration. The magnitude of the local magnetic stray field 55 can reach values up to 1000 Oe at the edges of the magnetoresistive element 10.

The pinning layer 24 usually contains a certain amount of thermally unstable grains which can be switched upon application of the external magnetic field. The stray field 55 can locally disturb the exchange coupling of the pinning layer 24, resulting in a hysteresis in the response of the magnetoresistive element 10 when the angle of the external magnetic field is varied. FIG. 2 reports simulated response of a 2D sensor comprising a magnetoresistive element 10 such as the one of FIG. 1, when the external magnetic field is rotated clockwise (positive angles) and counterclockwise (negative angles). A hysteresis is visible between the clockwise and counterclockwise rotation.

A possible solution destined to minimize such hysteresis comprises enhancing the exchange coupling between the pinning layer 24 and the reference layer 21. Alternatively, the reference layer 21 can comprises ferromagnetic materials having higher exchange stiffness, for example Co-rich alloys. However, there are only very limited alloys that have high exchange stiffness and that are compatible with the tunnel magnetoresistive technology. Another possible solution can include decreasing the thickness of the sense layer 23 such as to reduce the stray field 55. However, this is detrimental to the signal-to-noise ratio of the magnetoresistive element 10. Other solutions can include optimizing the growth of the pinning layer 24 and using a larger magnetoresistive element 10 such that the relative contribution of the edges of the magnetoresistive element 10 to reduce the response signal. The two latter solutions are not satisfactory.

US2010316890 discloses a laminated structure composed of sandwiching a tunnel barrier layer between magnetic pinned layers each having multilayer structure and magnetic free layers each having multilayer structure. The magnetic pinned layer having multilayer structure, the tunnel barrier layer, and the magnetic free layer having multilayer structure are stacked in this order on a substrate.

US2017140781 discloses a read sensor that includes an unbalanced SAF free layer structure. The unbalanced SAF free layer structure includes a first magnetic layer having a first magnetic moment value and a second magnetic layer having a second magnetic moment value that is different from the first magnetic moment value. A separation layer is included between the first magnetic layer and the second magnetic layer. The first magnetic layer and the second magnetic layer are antiferromagnetically coupled.

SUMMARY

The present disclosure concerns a magnetoresistive element comprising a tunnel barrier layer included between a reference layer having a reference magnetization and a sense layer having a sense magnetization. The sense layer comprises a SAF structure including a ferromagnetic first sense sublayer in contact with the tunnel barrier layer and separated from a ferromagnetic second sense sublayer by a first non-magnetic spacer layer such that the first sense sublayer is antiferromagnetically coupled to the second sense sublayer. The sense layer is configured such that a sense magnetic ratio defined as:

$$\Delta M = \frac{M_{SFM2} t_{FM2} - M_{SFM1} t_{FM1}}{M_{SFM2} t_{FM2} + M_{SFM1} t_{FM1}}$$

wherein $M_{SFM1}$ and $M_{SFM2}$ are the spontaneous magnetizations of, respectively, the first and second sense sublayers and $t_{FM1}$ and $t_{FM2}$ are the thicknesses of, respectively, the first and second sense sublayers. The sense magnetic ratio is between 0.1 and 0.25. The second sense sublayer comprises a spontaneous magnetization that increases with increasing distance from the sense spacer layer.

The present disclosure further concerns a 2D magnetic sensor comprising a plurality of the magnetoresistive element disclosed herein.

The ratio of the magnetic moment results in a non-null magnetic moment of the sense layer and a net stray field on the level of pinned layer will that is significantly suppressed.

The magnetoresistive element disclosed herein has a reduced hysteresis response when measuring an external magnetic field varying angularly. The magnetoresistive element has improved sensitivity, signal to noise ratio and has better sensor lifetime.

The present invention further concerns a 2D magnetic sensor comprising a plurality of the magnetoresistive element.

SHORT DESCRIPTION OF THE DRAWINGS

Exemplar embodiments of the invention are disclosed in the description and illustrated by the drawings in which:

FIG. 1 illustrates schematically a conventional magnetoresistive element;

FIG. 2 reports simulated response of a 2D sensor comprising the magnetoresistive element of FIG. 1;

FIG. 3 illustrates schematically a magnetoresistive element comprising a reference layer a sense layer and a tunnel barrier layer, wherein the sense layer comprises a sense SAF structure including a first sense sublayer separated from a second sense sublayer by a non-magnetic sense spacer layer, according to an embodiment;

FIG. 4 reports the ratio of the SAF stray field for a magnetoresistive element of the invention to the FM stray field for a conventional magnetoresistive element, as a function of the ratio of the magnetic moment of the first sense sublayer to the magnetic moment of the second sense sublayer;

FIG. 5 reports the ratio of the SAF stray field to the FM stray field as a function of the thickness of the second sense sublayer for a magnetoresistive element of the invention;

EXAMPLES OF EMBODIMENTS

Figure 1:
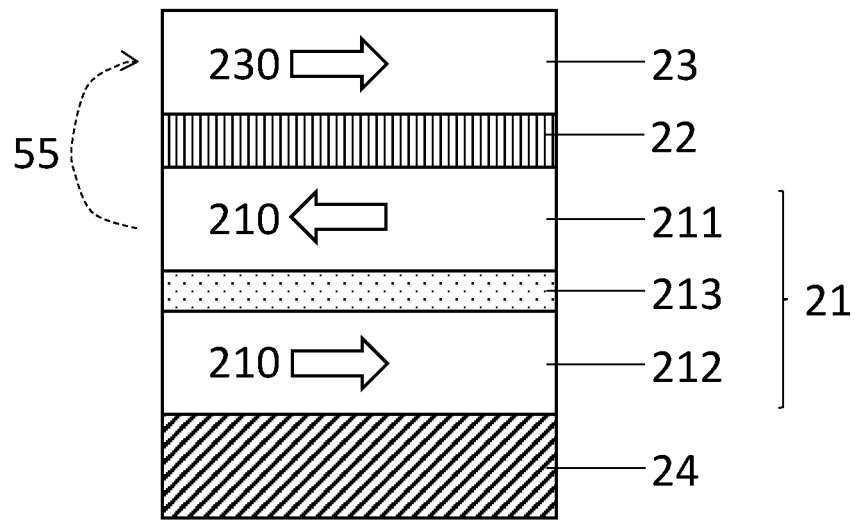
Figure 2:
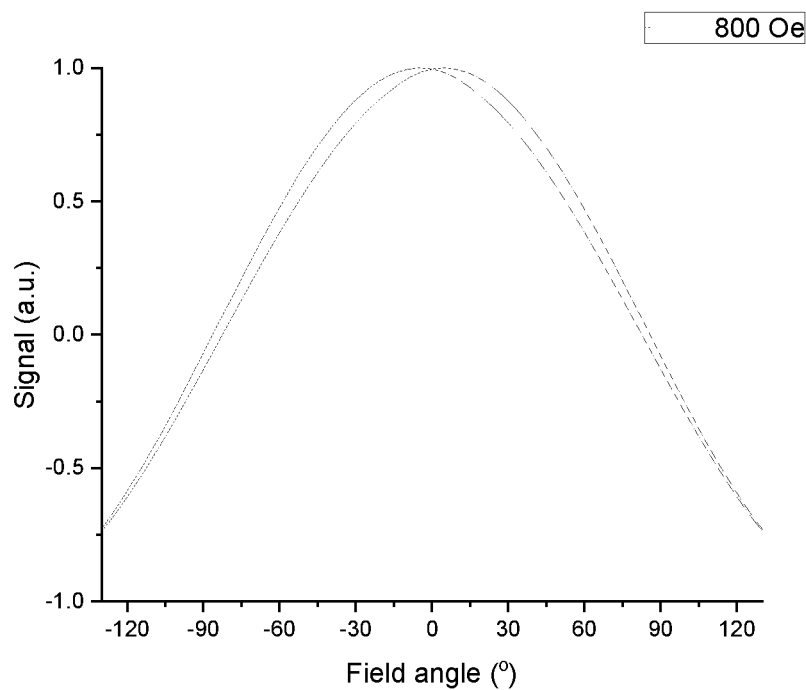
Figure 3:
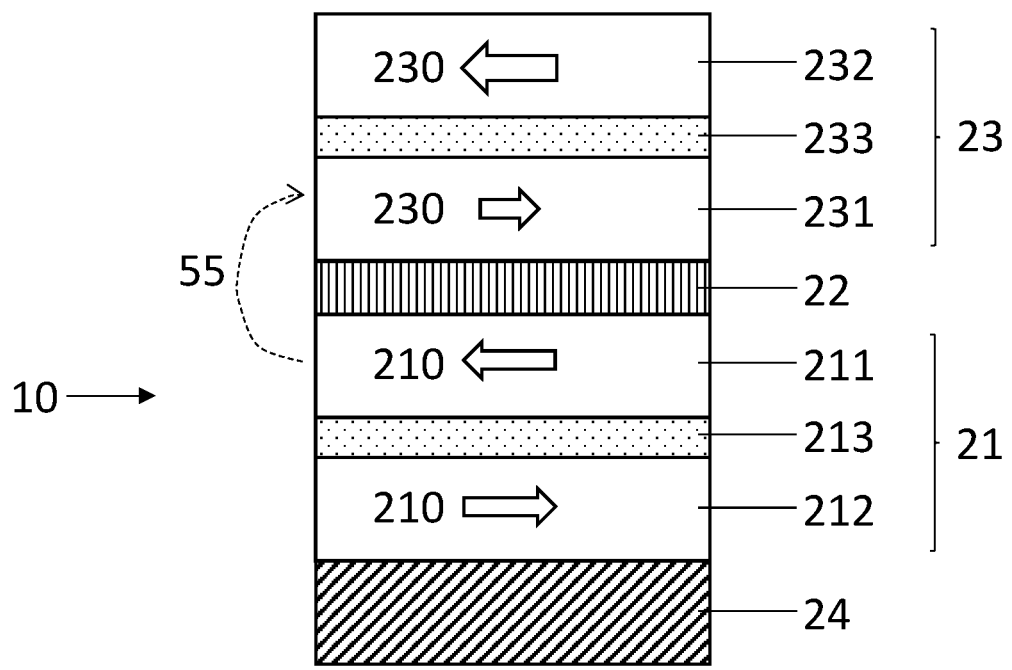

With reference to FIG. 3, a magnetoresistive element 10 is shown comprising a reference layer 21 having a reference magnetization 210 and a sense layer 23 having a sense magnetization 230. A tunnel barrier layer 22 is included between the reference layer 21 and the sense layer 23. The reference layer 21 comprises a reference SAF structure including a first reference sublayer 211, a second reference sublayer 212 in contact with the tunnel barrier layer 22 and a non-magnetic reference spacer layer 213 between the first and second reference sublayers 211, 212 such that the first reference sublayer 211 is antiferromagnetically coupled to the second reference sublayer 212. The sense layer 23 comprises a sense SAF structure including a first sense sublayer 231 in contact with the tunnel barrier layer 22 and separated from a second sense sublayer 232 by a non-magnetic first sense spacer layer 233 such that the first sense sublayer 231 is antiferromagnetically coupled to the second sense sublayer 232.

Preferably, the sense magnetization 230 is saturated.

In an embodiment, the magnetic moment of the first sense sublayer 231 is smaller than the magnetic moment of the second sense sublayer 232. More particularly, a sense magnetic ratio ΔM, i.e., the ratio of the magnetic moment of the first sense sublayer 231 to the magnetic moment of the second sense sublayer 232, can be defined by Equation (1):

$$\Delta M = \frac{M_{S_{FM2}} t_{FM2} - M_{S_{FM1}} t_{FM1}}{M_{S_{FM2}} t_{FM2} + M_{S_{FM1}} t_{FM1}} \tag{1}$$

where $M_{S_{FM1}}$ corresponds to the spontaneous magnetization of the first sense sublayer 231, $t_{FM1}$ corresponds to the thickness of the first sense sublayer 231, $M_{S_{FM2}}$ corresponds to the spontaneous magnetization of the second sense sublayer 232 and $t_{FM2}$ corresponds to the thickness of the second sense sublayer 232.

In a preferred embodiment, the sense magnetic ratio ΔM is between 0.1 and 0.25.

Figure 4:
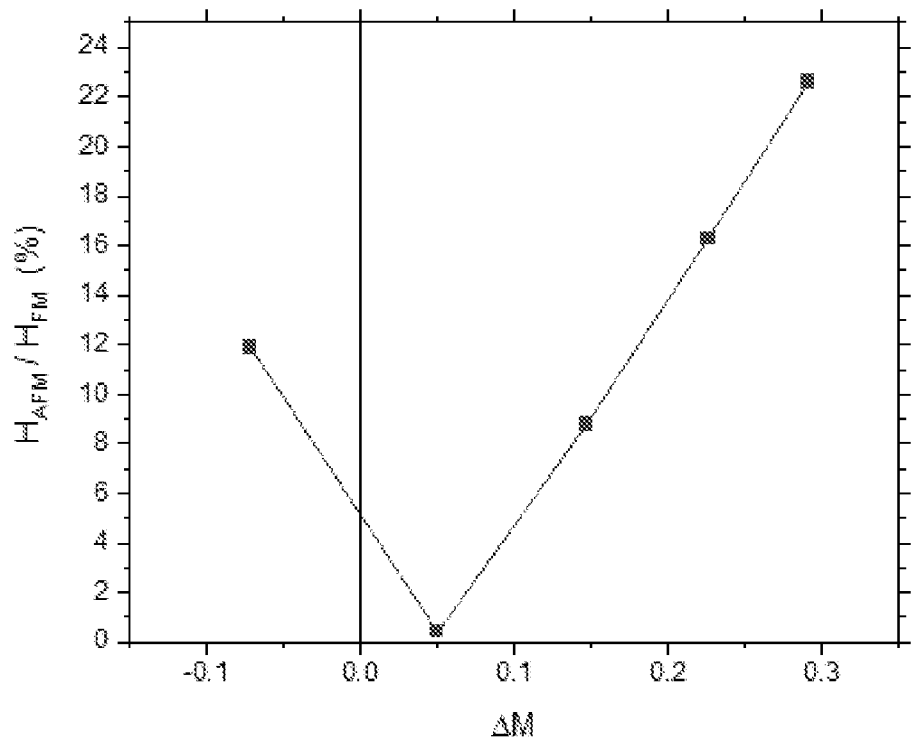

FIG. 4 reports the ratio of the SAF stray field $H_{AFM}$ to the FM stray field $H_{FM}$ as a function of the sense magnetic ratio ΔM. Here, the SAF stray field $H_{AFM}$ corresponds to the net stray field 55 generated by the sense SAF structure 23, i.e., the stray field resulting from the different sense sublayers 231, 232. The FM stray field $H_{FM}$ corresponds to the stray field generated by the sense layer 23 comprising a single ferromagnetic layer or several ferromagnetically coupled ferromagnetic layers. The SAF stray field $H_{AFM}$ was calculated for the first sense sublayer 231 having a thickness of 2 nm and for the second sense sublayer 232 having a thickness between 2 nm and 6 nm. The FM stray field $H_{FM}$ was calculated for a ferromagnetic layer having a thickness of between 0 nm and 4 nm. FIG. 4 shows that a sense magnetic ratio ΔM of 0.2 yields a ratio of the SAF stray field $H_{AFM}$ to the FM stray field $H_{FM}$ of 14%.

Figure 5:
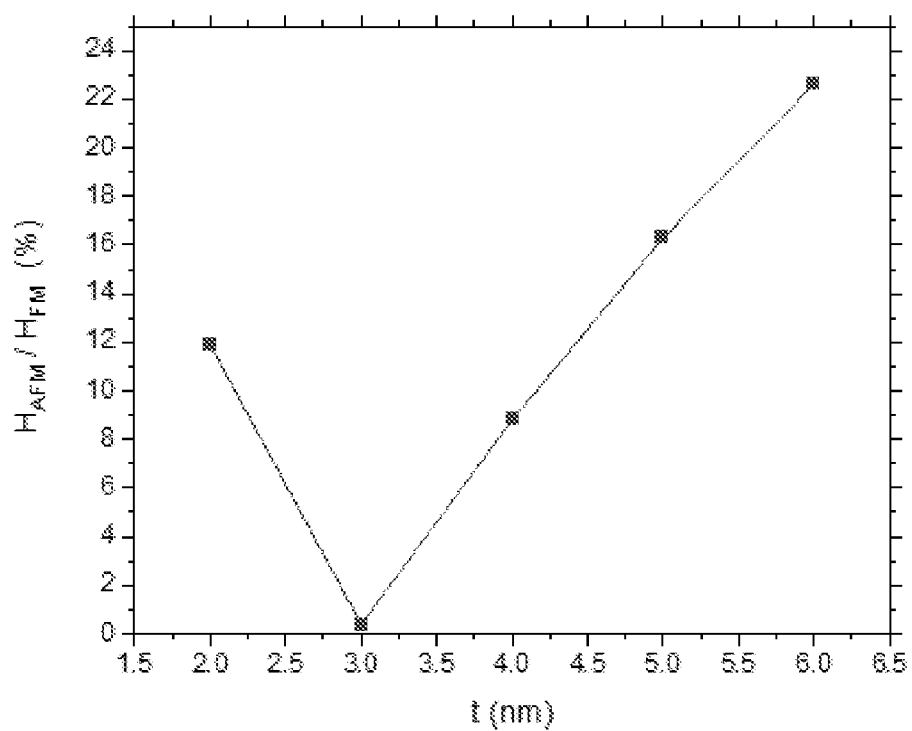

FIG. 5 reports the ratio of the SAF stray field $H_{AFM}$ to the FM stray field $H_{FM}$ as a function of the thickness of the second sense sublayer 232. The first sense sublayer 231 has a thickness of 2 nm. When the ratio of the SAF stray field $H_{AFM}$ to the FM stray field $H_{FM}$ is null, and when the sense magnetic ratio ΔM is null, the sense layer 23 loses its capability to sense the external magnetic field. This corresponds to the second sense sublayer 232 having a thickness of 3 nm in the example of FIG. 5.

Figure 6:
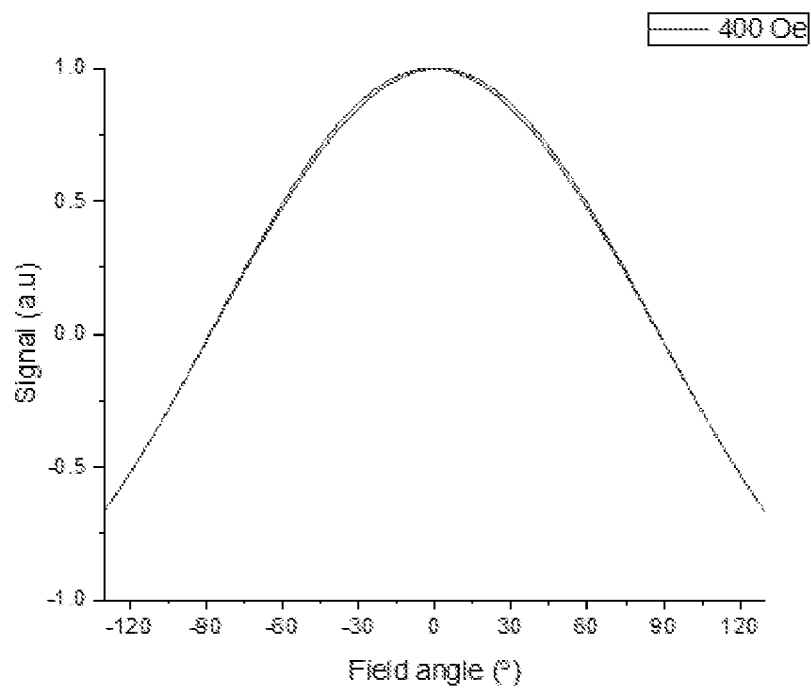
FIG. 6 shows the variation of a signal measured by the magnetoresistive element of the invention as a function of the angle of an external magnetic field.

A sense magnetic ratio ΔM between 0.1 and 0.25 provides a good sensitivity of the magnetoresistive element 10 to the external magnetic field. Moreover, it reduces the net stray field 55 on the reference layer 21 such that the response of the magnetoresistive element 10 to an angularly varying external magnetic field shows substantially no hysteresis. FIG. 6 shows the variation of a signal measured by the magnetoresistive element 10 (such as a resistance value) as a function of the angle of the external magnetic field being measured. Here, the net stray field 55 generated by the sense layer 23 has a magnitude of 400 Oe. Almost no hysteresis is observed.

The magnetoresistive element 10 described herein can have lower magnetic noise and higher tunnel magnetoresistance (TMR) by using thick magnetic layers in the sensing layer 23. The reduction of the net stray field 55 generated by the sense layer 23 and acting on the pinned reference layer 21 can further have enhanced stability to high temperature, improved life-time stability and improved overall performance.

As shown in FIGS. 4 and 5, the ratio of the magnetic moments in the first and second sense sublayers 231, 232 can be varied in order to optimize the net stray field 55 by selecting the thickness of the first and second sense sublayers 231, 232, by selecting the composition of the first and second sense sublayers 231, 232 and/or by other parameters of the sense layer 23.

In one aspect, the first and second sense sublayers 231, 232 can comprise a ferromagnetic material such as a ferromagnetic alloy based on any one of Fe, Co, Ni, for example CoFe or NiFe. At least one of the first and second sense sublayers 231, 232 can further comprise a non-magnetic element such as B, Ta, Ru or W or a combination of these elements. More particularly, the first sense sublayer 231 comprises nonmagnetic elements in order to dilute the ferromagnetic material constituting the first sense sublayer 231 and decrease its spontaneous magnetization 230.

In another aspect, the second sense sublayer 232 has a greater thickness than the first sense sublayer 231.

In one aspect, the first sense spacer layer 233 can comprise a non-magnetic material such as, but not limited to, Ru, W, Mo or Ir or a combination of these elements.

Figure 7:
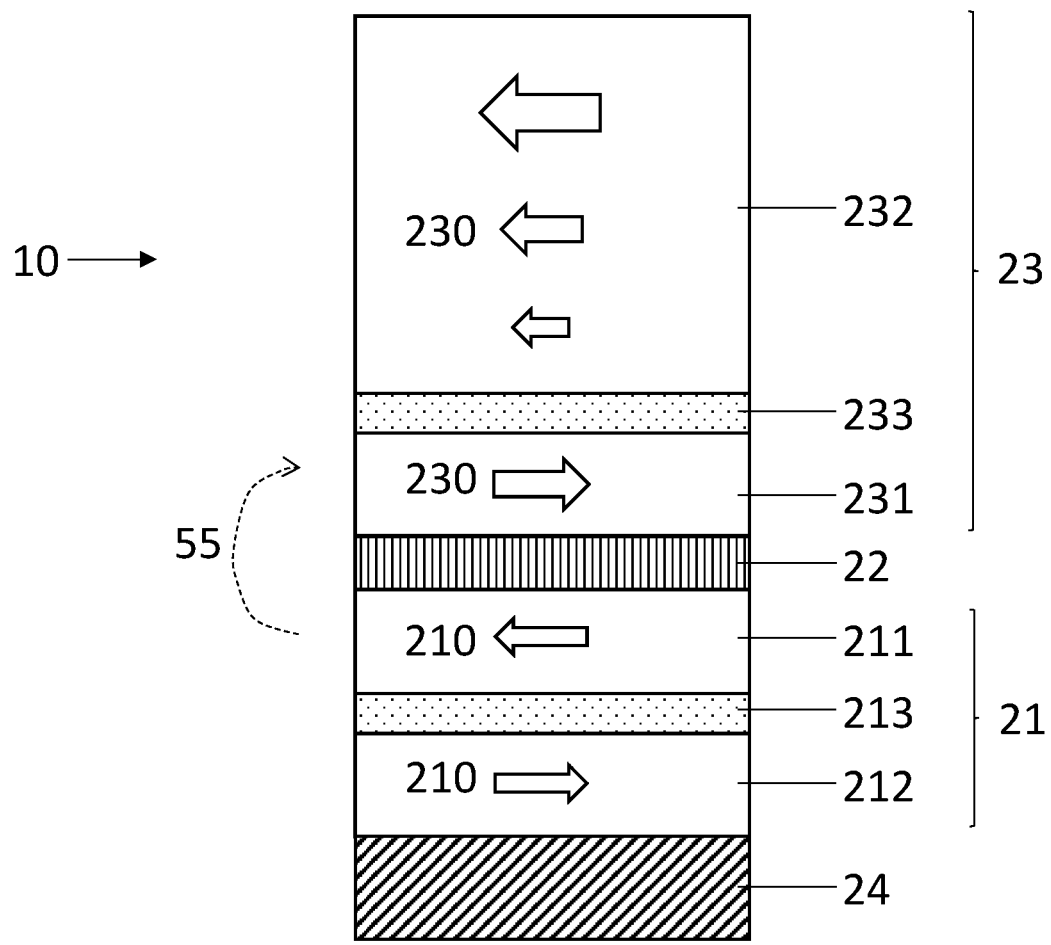
FIG. 7 shows the magnetoresistive element, according to another embodiment.

With reference to FIG. 7, the magnetoresistive element 10 is shown according to another embodiment, wherein the first sense sublayer 231 is antiferromagnetically coupled to the second sense sublayer 232, and wherein the second sense sublayer 232 comprises a gradient of the sense spontaneous magnetization 230. More particularly the sense spontaneous magnetization 230 in the second sense sublayer 232 increases with increasing distance from the first sense spacer layer 233.

The net spontaneous magnetization 230 of the second sense sublayer 232 can be adjusted to compensate the spontaneous magnetization 230 of the first sense sublayer 231 such as to adjust the sense magnetic ratio $\Delta M$, for example between 0.1 and 0.25. Here, $M_{SFM2}$ corresponds to the net spontaneous magnetization of the second sense sublayer 232.

Since the magnitude of the stray field 55 decreases as the cube of the distance, the larger sense magnetization 230 in the portion of the second sense sublayer 232 farthest from the reference layer 21 does not contribute significantly to the net stray field 55 at the level of the reference layer 21. On the other hand, the larger sense magnetization 230 allows for increasing the TMR of the magnetoresistive element 10.

The second sense sublayer 232 has a sense spontaneous magnetization 230 that is smaller, for example at least two times, than the sense spontaneous magnetization 230 of the first sense sublayer 231 and, thus, generate a smaller net stray field 55 on the reference layer 21. On the level of the reference layer 21, the net stray field 55 produced by the second sense sublayer 232 is smaller than the one produced by the first sense sublayer 231.

In one aspect, the second sense sublayer 232 comprises a gradient of nonmagnetic impurities. More particularly, the second sense sublayer 232 comprises nonmagnetic impurities in a concentration that decreases with increasing distance from the first sense spacer layer 233. The increasing content of nonmagnetic impurities dilutes the ferromagnetic material of the second sense sublayer 232 towards the first sense spacer layer 233.

Figure 8:
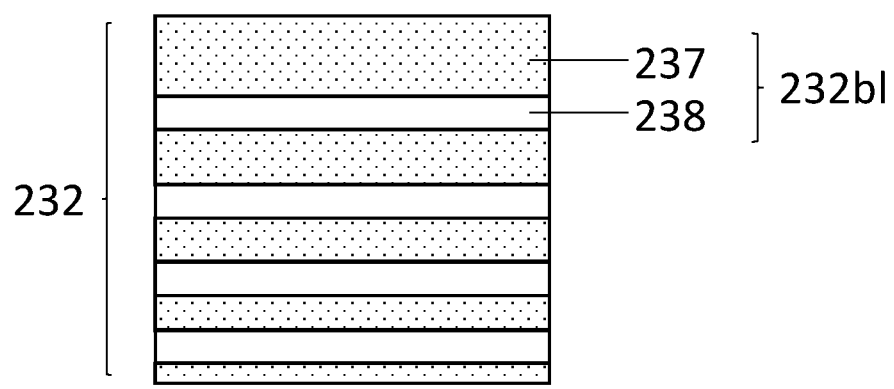
FIG. 8 shows a detail of the second sense sublayer according to another embodiment.

FIG. 8 shows a detail of the second sense sublayer 232 according to another aspect. Here, the second sense sublayer 232 comprises a plurality of ferromagnetic sense bi-layers 232bl, wherein each sense bi-layer 232bl includes a low spontaneous sense layer 237 and a high spontaneous sense layer 238. The high spontaneous sense layer 238 has a sense spontaneous magnetization 230 higher than the one of the low spontaneous sense layer 237. The thicknesses of the low spontaneous sense layer 237 relative to the thicknesses of the high spontaneous sense layer 238 decreases with increasing distance from the first sense spacer layer 233.

Any one of, alone or in combination, the thickness of the second sense sublayer 232, the gradient of the sense spontaneous magnetization 230 or the arrangement of the sense bi-layers 232bl, can be adjusted in order to obtain the ratio of the magnetic moment of the first sense sublayer 231 to the magnetic moment of the second sense sublayer 232 between 0.1 and 0.25, and to decrease the net stray field 55 applied on the reference layer 21.

Figure 9:
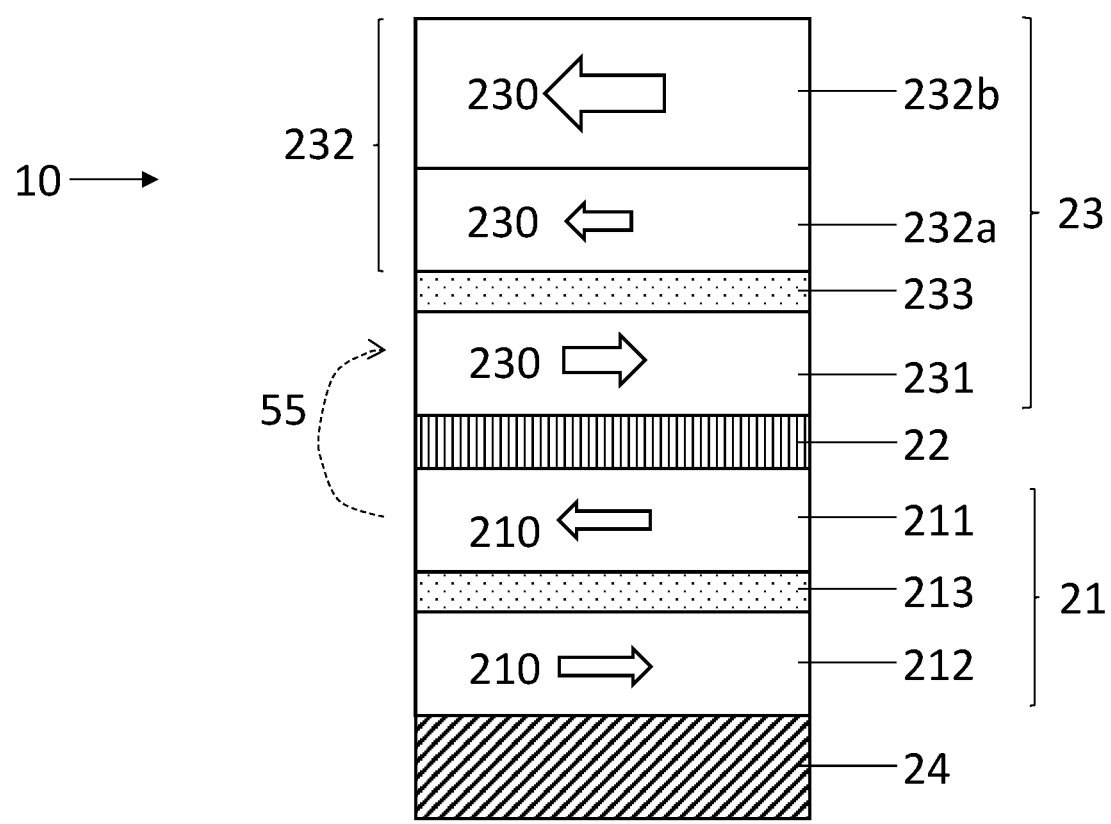
FIG. 9 shows the magnetoresistive element, according to yet another embodiment.

The configuration of the magnetoresistive element 10 shown in FIGS. 7 and 8 allows for obtaining a low stray field 55 and have a sense magnetic ratio $\Delta M$ between 0.1 and 0.25 using only a single sense spacer layer 233. In the case the second sense sublayer 232 comprises a plurality of ferromagnetic sense bi-layers 232bl, the term $M_{SFM2}$ corresponds to the net spontaneous magnetization of the plurality of ferromagnetic sense bi-layers 232bl and $t_{FM2}$ corresponds to the thickness of the second sense sublayer 232 comprising the plurality of ferromagnetic sense bi-layers 232bl. FIG. 9 illustrates the magnetoresistive element 10 according to yet another embodiment, wherein the second sense sublayer 232 comprises a proximal second sense sublayer 232a and a distal second sense sublayer 232b. The distal second sense sublayer 232b has a sense spontaneous magnetization 230 that is at least two times higher than the sense spontaneous magnetization 230 of the proximal second sense sublayer 232a. The proximal second sense sublayer 232a is ferromagnetically coupled to the distal second sense sublayer 232b.

Here, the sense magnetic ratio $\Delta M$ does not depend on a specific arrangement of the first and second sense layers 231, 232a, 232b but rather on the net magnetic moment of these layers. More particularly, the term $M_{SFM2}$ $t_{FM2}$ in Equation (1) corresponds to $M_{SFM2a}$ $t_{FM2a}+M_{SFM2b}$ $t_{FM2b}$, where $M_{SFM2a}$ and $t_{FM2a}$ respectively correspond to the spontaneous magnetization and thickness of the proximal second sense sublayer 232a and where $M_{SFM2b}$ and $t_{FM2b}$, respectively correspond to the spontaneous magnetization and thickness of the distal second sense sublayer 232b.

In one aspect, the lower sense spontaneous magnetization 230 of the proximal second sense sublayer 232a relative to the distal second sense sublayer 232b can be obtained by including nonmagnetic impurities in the ferromagnetic proximal second sense sublayer 232a such as to dilute the spontaneous magnetization of the ferromagnetic material. Alternatively or in combination, the relative lower sense spontaneous magnetization 230 of the proximal second sense sublayer 232a can be obtained by the distal second sense sublayer 232b having a greater thickness that the thickness of the proximal second sense sublayer 232a.

The sense spontaneous magnetization 230 of the proximal second sense sublayer 232a can be adjusted to compensate the stray field generated by the first sense sublayer 231 and decrease the net stray field 55 at the reference layer 21. Since the magnitude of the stray field 55 decreases as the cube of the distance, the stray field generated by the thicker distal second sense sublayer 232b has a negligible contribution in the net stray field 55 at the reference layer 21. The larger sense magnetization 230 of the distal second sense sublayer 232b allows for increasing the TMR of the magnetoresistive element 10.

Figure 10:
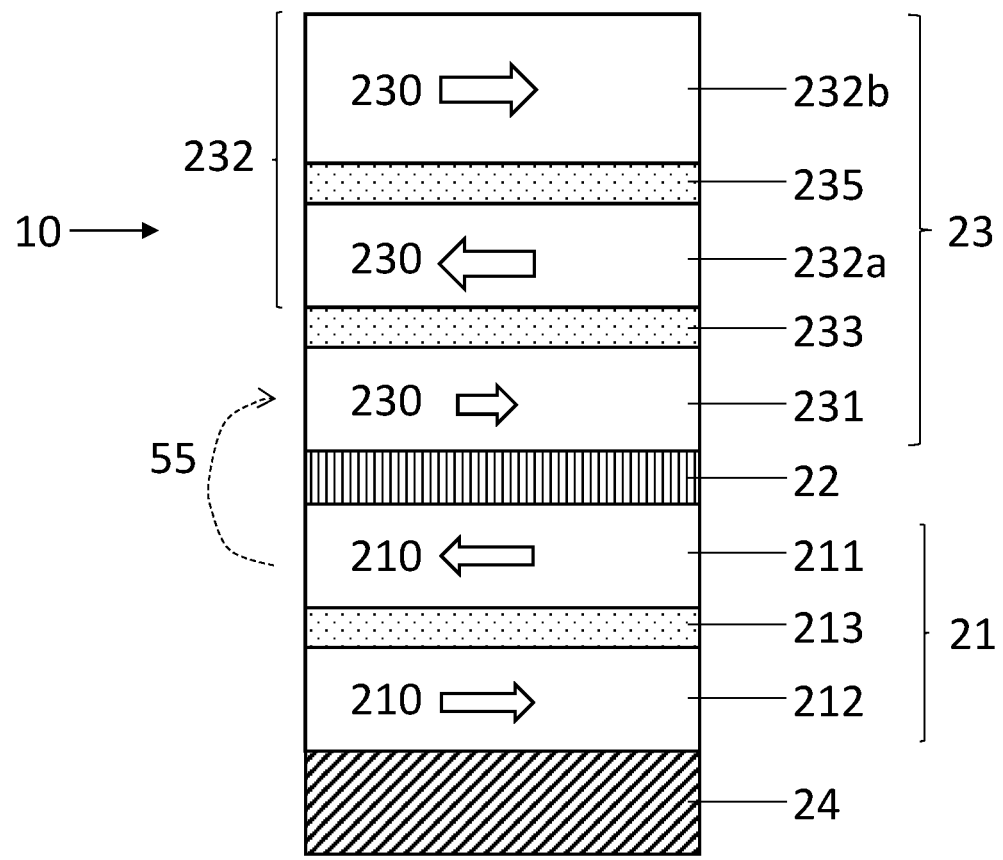
FIG. 10 illustrates the magnetoresistive element, according to yet another embodiment.

FIG. 10 illustrates a variant of the magnetoresistive element 10 shown in FIG. 9, wherein the second sense sublayer 232 comprises a proximal second sense sublayer 232a separated from a distal second sense sublayer 232b by a non-magnetic second sense spacer layer 235. The second sense spacer layer 235 can comprise a non-magnetic material such as, but not limited to, Ru, W, Mo or Ir or a combination of these elements. In this configuration, the distal second sense sublayer 232b is antiferromagnetically coupled to the proximal second sense sublayer 232a.

Similarly to the configuration of the magnetoresistive element 10 shown in FIG. 9, the thickness of the proximal second sense sublayer 232a can be adjusted to compensate the stray field generated by the first sense sublayer 231 and decrease the net stray field 55 at the reference layer 21. The stray field generated by the thicker distal second sense sublayer 232b has a negligible contribution in the net stray field 55 at the reference layer 21. The larger sense magnetization 230 of the distal second sense sublayer 232b allows for increasing the TMR of the magnetoresistive element 10.

In a variant not illustrated, the sequence: "first sense layer 231/first sense spacer layer 233/second sense layer 232" can be repeated a plurality of times forming a multi-layered structure. Such multi-layered structure can have a spontaneous magnetization that is lower than the spontaneous magnetization of the distal second sense layer 232b. The multi-layered structure can be strongly coupled to the distal second sense layer 232b.

The thickness of the first sense layer 231 and/or the second sense layer 232, as well as the thickness of the proximal and distal second sense layers 232a, 232b in the magnetoresistive element 10 according to the configuration of FIGS. 9 and 10, can be adjusted in order to decrease the stray field 55.

Figure 11:
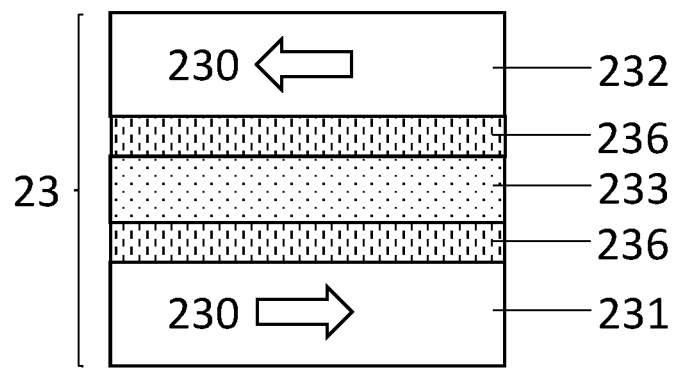
FIG. 11 shows a detail of the sense layer, according to an embodiment.

FIG. 11 shows a detail of the sense layer 23 according to an embodiment, wherein the sense layer 23 further comprises an intermediate ferromagnetic sense layer 236 on each side of the first sense spacer layer 233 and in contact with the first sense spacer layer 233. The intermediate ferromagnetic sense layer 236 can be a nanolayer, for example have a thickness of about 1 nm. The intermediate ferromagnetic sense layer 236 can comprises any one of a Co or CoFe-based alloy. Preferably, the intermediate ferromagnetic sense layer 236 has a high spontaneous magnetization. For example, the intermediate ferromagnetic sense layer 236 can comprises a CoFe alloy containing 25 to 50% wt Fe.

Improved sensing layer structure with two or more antiferromagnetically coupled sublayers. Proper choice of sense layer materials and sense layer thickness provides significant reduction of hysteresis in sensor angular response, improves sensitivity, signal to noise ratio and longevity of sensor lifetime.

In an embodiment, a 2D magnetic sensor comprises a plurality of the magnetoresistive element 10 disclosed herein.

REFERENCE NUMBERS AND SYMBOLS 10 magnetoresistive element
21 reference layer, reference SAF structure
210 reference magnetization
211 first reference sublayer
212 second reference sublayer
213 reference spacer layer
22 tunnel barrier layer
23 sense layer, sense SAF structure
230 sense magnetization
231 first sense sublayer
232 second sense sublayer
232a proximal second sense sublayer
232b distal second sense sublayer
232bl sense bi-layer
233 first sense spacer layer
234 third sense sublayer
235 second sense spacer layer
236 intermediate ferromagnetic sense layer
237 low spontaneous sense layer
238 high spontaneous sense layer
24 pinning layer, antiferromagnetic layer
55 local magnetic stray field, net stray field
ΔM sense magnetic ratio
$H_{AFM}$ SAF stray field
$H_{FM}$ FM stray field

The invention claimed is:

1. A magnetoresistive element for a 2D magnetic sensor, the magnetoresistive element comprising a tunnel barrier layer included between a reference layer having a reference magnetization and a sense layer having a sense magnetization;
   wherein the sense layer comprises a synthetic antiferromagnetic (SAF) structure including a ferromagnetic first sense sublayer in contact with the tunnel barrier layer and separated from a ferromagnetic second sense sublayer by a first non-magnetic spacer layer such that the first sense sublayer is antiferromagnetically coupled to the second sense sublayer;
   wherein the sense layer is configured such that a sense magnetic ratio ΔM is defined as:

$$\Delta M = \frac{M_{S_{FM2}} t_{FM2} - M_{S_{FM1}} t_{FM1}}{M_{S_{FM2}} t_{FM2} + M_{S_{FM1}} t_{FM1}}$$

wherein $M_{SFM1}$ and $M_{SFM2}$ are the spontaneous magnetizations of, respectively, the first and second sense sublayers and $t_{FM1}$ and $t_{FM2}$ are the thicknesses of, respectively, the first and second sense sublayers;
   wherein the sense magnetic ratio ΔM is between 0.1 and 0.25; and
   wherein the second sense sublayer comprises a spontaneous magnetization that increases with increasing distance from the sense spacer layer.

2. The magnetoresistive element according to claim 1, wherein the first sense sublayer has a thickness between 1 nm and 3 nm and the second sense sublayer has a thickness between 2 nm and 6 nm.

3. The magnetoresistive element according to claim 2, wherein the second sense sublayer has a greater thickness than the first sense sublayer.

4. The magnetoresistive element according to claim 3, wherein the first sense sublayer comprises nonmagnetic elements in order to decrease its spontaneous magnetization.

5. The magnetoresistive element according to claim 1, wherein the sense spacer layer comprises Ru, W, Mo or Ir or a combination of these elements.

6. The magnetoresistive element according to claim 1, wherein the second sense sublayer comprises a ferromagnetic material containing nonmagnetic impurities in a concentration that decreases with increasing distance from the sense spacer layer.

7. The magnetoresistive element according to claim 1,
   wherein the second sense sublayer comprises a plurality of ferromagnetic sense bi-layers, each sense bi-layer including a low spontaneous sense layer and a high spontaneous sense layer having a spontaneous magnetization higher than the one of the low spontaneous sense layer; and
   wherein the thicknesses of the low spontaneous sense layer relative to the thicknesses of the high spontaneous sense layer decreases with increasing distance from the sense spacer layer.

8. The magnetoresistive element according to claim 1,
wherein the second sense sublayer comprises a proximal second sense sublayer proximal the first sense spacer layer and a distal second sense sublayer distal the first sense spacer layer and ferromagnetically coupled to the proximal second sense sublayer; and
wherein the distal second sense sublayer has a spontaneous magnetization that is at least two times greater than the proximal second sense sublayer.

9. The magnetoresistive element according to claim 8, wherein the proximal second sense sublayer comprises a ferromagnetic material containing nonmagnetic impurities decreasing the spontaneous magnetization of the ferromagnetic material.

10. The magnetoresistive element according to claim 1, wherein the second sense sublayer comprises a proximal second sense sublayer proximal the first sense spacer layer and a distal second sense sublayer distal the first sense spacer layer, the proximal second sense sublayer being separated from the distal second sense sublayer by a non-magnetic second sense spacer layer and antiferromagnetically coupled to the distal second sense sublayer.

11. The magnetoresistive element according to claim 10, wherein the spontaneous magnetization of the distal second sense sublayer is higher than the spontaneous magnetization of the first sense layer and the proximal second sense sublayer.

12. The magnetoresistive element according to claim 10, comprising a plurality of the sense SAF structures.

13. The magnetoresistive element according to claim 1, wherein the sense layer further comprises an intermediate ferromagnetic sense layer on each side of the sense spacer layer and in contact with the sense spacer layer.

14. A 2D magnetic sensor comprising a plurality of the magnetoresistive elements according to claim 1.

* * * * *

UNITED STATES PATENT AND TRADEMARK OFFICE
CERTIFICATE OF CORRECTION

| | |
|---|---|
| PATENT NO. | : 12,174,276 B2 |
| APPLICATION NO. | : 18/245380 |
| DATED | : December 24, 2024 |
| INVENTOR(S) | : Andrey Timopheev et al. |

It is certified that error appears in the above-identified patent and that said Letters Patent is hereby corrected as shown below:

In the Specification

Column 7, Line 36, delete "25" and replace with --25%--.

Signed and Sealed this
First Day of July, 2025

Coke Morgan Stewart
*Acting Director of the United States Patent and Trademark Office*